(12) United States Patent
Hu

(10) Patent No.: US 12,328,982 B2
(45) Date of Patent: Jun. 10, 2025

(54) DISPLAY PANEL AND METHOD FOR PREPARING DISPLAY PANEL

(71) Applicant: Shenzhen China Star Optoelectronics Semiconductor Display Technology Co., Ltd., Guangdong (CN)

(72) Inventor: Xiaobo Hu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/600,167

(22) PCT Filed: Aug. 30, 2021

(86) PCT No.: PCT/CN2021/115278
§ 371 (c)(1),
(2) Date: Sep. 30, 2021

(87) PCT Pub. No.: WO2022/267217
PCT Pub. Date: Dec. 29, 2022

(65) Prior Publication Data
US 2024/0030394 A1    Jan. 25, 2024

(30) Foreign Application Priority Data
Jun. 25, 2021   (CN) .......................... 202110709453.1

(51) Int. Cl.
*H01L 25/07*    (2006.01)
*H01L 25/075*   (2006.01)
(Continued)

(52) U.S. Cl.
CPC ....... *H10H 20/857* (2025.01); *H01L 25/0753* (2013.01); *H10H 20/0364* (2025.01)

(58) Field of Classification Search
CPC ................. H01L 33/62; H01L 25/0753; H01L 2933/0066; H05K 1/189; H05K 2201/10128; H10K 59/131; G09F 9/33
See application file for complete search history.

(56) References Cited

U.S. PATENT DOCUMENTS

2016/0349565 A1   12/2016  Kim et al.
2018/0047802 A1*   2/2018  Yoon .................... H10K 59/131
(Continued)

FOREIGN PATENT DOCUMENTS

| CN | 108777114 | 11/2018 |
|----|-----------|---------|
| CN | 110930866 | 3/2020 |

(Continued)

*Primary Examiner* — Towfiq Elahi

(57) ABSTRACT

The present disclosure discloses a display panel and a method for preparing a display panel. The display panel includes a first substrate, a second substrate, a signal wiring portion, a first outer lead wiring portion, a second outer lead wiring portion, a through-hole portion, and a bridging wiring portion. The first outer lead wiring portion is disposed on a side surface of the first substrate along a light emitting direction of the display panel, and the second outer lead wiring portion is disposed on a side surface of the second substrate away from the first substrate and is electrically connected to the first outer lead wiring portion through the bridging wiring portion disposed in the through-hole portion.

8 Claims, 6 Drawing Sheets

(51) Int. Cl.
*H10H 20/857* (2025.01)
*H10H 20/01* (2025.01)

(56) References Cited

U.S. PATENT DOCUMENTS

| | | | | |
|---|---|---|---|---|
| 2019/0094641 A1 | | 3/2019 | Choi et al. | |
| 2019/0214600 A1* | | 7/2019 | Park | H10K 59/8722 |
| 2019/0221721 A1* | | 7/2019 | Tang | H01L 25/0753 |
| 2021/0111358 A1* | | 4/2021 | Seo | H10K 77/111 |

FOREIGN PATENT DOCUMENTS

| | | |
|---|---|---|
| CN | 111430406 | 7/2020 |
| CN | 111463228 | 7/2020 |
| CN | 111511100 | 8/2020 |
| CN | 111584562 | 8/2020 |
| CN | 112526792 | 3/2021 |

* cited by examiner

DISPLAY PANEL AND METHOD FOR PREPARING DISPLAY PANEL

RELATED APPLICATIONS

This application is a National Phase of PCT Patent Application No. PCT/CN2021/115278 having International filing date of Aug. 30, 2021, which claims the benefit of priority of Chinese Patent Application No. 202110709453.1 filed on Jun. 25, 2021. The contents of the above applications are all incorporated by reference as if fully set forth herein in their entirety.

FIELD AND BACKGROUND OF THE INVENTION

The present disclosure relates to the field of display technologies, and in particular, to a display panel and a method for preparing a display panel.

A light emitting diode (LED) is a semiconductor electronic component that can convert electric energy into light energy. Having features like small size, long service life, rich color, and low energy consumption, the LED is widely used in the fields of lighting, a display screen, signal light, backlight, toy, and the like. A mini LED, also known as a sub-millimeter light emitting diode and being 80 microns to 200 microns in size usually, is a new generation of LED technology taking on the characteristics of high efficiency, high reliability, high brightness, and fast response time of a small-pitch LED, and having lower power consumption and cost than the small-pitch LED.

Currently, a relatively long outer lead bonding (OLB) region is usually required to be reserved on an edge of a mini LED display panel, for bonding a chip on film (COF) and a printed circuit board (PCB), resulting in a relatively wide frame of the display panel. In addition, a large-sized mini LED display panel is usually formed by splicing a plurality of small-sized mini LED display panels. The relatively wide frame may cause a relatively large splice joint during the splicing, affecting the final display effect.

SUMMARY OF THE INVENTION

The present disclosure provides a display panel and a method for preparing a display plane, which can effectively narrow the width of a frame of a display panel and optimize the display effect.

The present disclosure provides a display panel, including a display region and a non-display region disposed outside at least one side of the display region, and the display panel further includes:
  a first substrate;
  a second substrate, disposed on a side surface of the first substrate facing away from a light emitting direction of the display panel;
  a signal wiring portion, disposed on a side surface of the first substrate along the light emitting direction of the display panel and disposed in the display region;
  a first outer lead wiring portion, disposed on the side surface of the first substrate along the light emitting direction of the display panel and in the non-display region, and electrically connected to the signal wiring portion;
  a second outer lead wiring portion, disposed on a side surface of the second substrate facing away from the first substrate;
  a through-hole portion, running through the first substrate and the second substrate; and
  a bridging wiring portion, filled in the through-hole portion, and electrically connected to the first outer lead wiring portion and the second outer lead wiring portion respectively.

In the display panel provided in an embodiment of the present disclosure, the second outer lead wiring portion is disposed on an inner side of the first outer lead wiring portion close to the display region.

In the display panel provided in an embodiment of the present disclosure, the signal wiring portion includes a plurality of signal wirings, the first outer lead wiring portion includes a plurality of first outer lead wirings electrically connected to the plurality of signal wirings one by one, the through-hole portion includes a plurality of through holes, the bridging wiring portion includes a plurality of bridging wirings correspondingly formed in the plurality of through holes, and the second outer lead wiring portion includes a plurality of second outer lead wirings, any one of the second outer lead wirings being electrically connected to the corresponding first outer lead wiring through the bridging wiring.

In the display panel provided in an embodiment of the present disclosure, an orthographic projection of the through hole on the first substrate overlaps with an orthographic projection of the first outer lead wiring on the first substrate, and/or the orthographic projection of the through hole on the first substrate overlaps with an orthographic projection of the second outer lead wiring on the first substrate.

In the display panel provided in an embodiment of the present disclosure, the through hole runs through the first outer lead wiring, and/or the through hole runs through the second outer lead wiring, and allows the bridging wiring to be electrically connected to a corresponding side wall of the first outer lead wiring and/or the second outer lead wiring.

In the display panel provided in an embodiment of the present disclosure, the orthographic projections of the plurality of through holes on the first substrate are arranged in at least two columns along a direction perpendicular to an extending direction of the first outer lead wirings, and two adjacent through holes are arranged alternately along the extending direction of the first outer lead wirings.

In the display panel provided in an embodiment of the present disclosure, the through hole is provided corresponding to a center of the first outer lead wiring along the extending direction.

In the display panel provided in an embodiment of the present disclosure, a shape of the orthographic projection of the through hole on the first substrate is a circle, an ellipse, a square, or a rectangle.

In the display panel provided in an embodiment of the present disclosure, a material of the first substrate includes a polyimide material or a film material, and a material of the second substrate includes a film material.

An embodiment of the present disclosure also provides a method for preparing a display panel, including steps of:
  S10: providing a first substrate, and forming a signal wiring portion and a first outer lead wiring portion on the first substrate, the signal wiring portion being electrically connected to the first outer lead wiring portion;
  S20: providing a second substrate, and forming a second outer lead wiring portion on the second substrate;
  S30: aligning and attaching a side surface of the second substrate facing away from the second outer lead wiring portion to a side surface of the first substrate facing away from the signal wiring portion and the first outer lead wiring portion;

S40: forming a through-hole portion running through the first substrate and the second substrate; and S50: forming a bridging wiring portion in the through-hole portion, the bridging wiring portion being electrically connected to the first outer lead wiring portion and the second outer lead wiring portion respectively.

In the method for preparing a display panel provided in an embodiment of the present disclosure, the second outer lead wiring portion is formed on an inner side of the first outer lead wiring portion close to the display region.

In the method for preparing a display panel provided in an embodiment of the present disclosure, the signal wiring portion includes a plurality of signal wirings, the first outer lead wiring portion includes a plurality of first outer lead wirings electrically connected to the plurality of signal wirings one by one, the through-hole portion includes a plurality of through holes, the bridging wiring portion includes a plurality of bridging wirings correspondingly formed in the plurality of through-holes, and the second outer lead wiring portion includes a plurality of second outer lead wirings, any one of the second outer lead wirings being electrically connected to the corresponding first outer lead wiring through the bridging wiring.

In the method for preparing a display panel provided in an embodiment of the present disclosure, an orthographic projection of the through hole on the first substrate overlaps with an orthographic projection of the first outer lead wiring on the first substrate, and/or the orthographic projection of the through hole on the first substrate overlaps with an orthographic projection of the second outer lead wiring on the first substrate.

In the method for preparing a display panel provided in an embodiment of the present disclosure, the through hole runs through the first outer lead wiring, and/or the through hole runs through the second outer lead wiring, and allows the bridging wiring to be electrically connected to a corresponding side wall of the first outer lead wiring and/or the second outer lead wiring.

In the method for preparing a display panel provided in an embodiment of the present disclosure, the orthographic projections of the plurality of through holes on the first substrate are arranged in at least two columns along a direction perpendicular to an extending direction of the first outer lead wirings, and two adjacent through holes are arranged alternately along the extending direction of the first outer lead wirings.

In the method for preparing a display panel provided in an embodiment of the present disclosure, the through hole is provided corresponding to a center of the first outer lead wiring along the extending direction.

In the method for preparing a display panel provided in an embodiment of the present disclosure, a shape of the orthographic projection of the through hole on the first substrate is a circle, an ellipse, a square, or a rectangle.

In the method for preparing a display panel provided in an embodiment of the present disclosure, a material of the first substrate includes a polyimide material or a film material, and a material of the second substrate includes a film material.

Compared with the prior art, the present disclosure provides a display panel and a method for preparing a display panel. In the display panel, an outer lead bonding (OLB) region for bonding a chip on film (COF) and a printed circuit board (PCB) is divided into two parts. One part is a first outer lead wiring portion disposed on a side surface of a first substrate facing a light emitting direction, and the other part is a second outer lead wiring portion disposed on a side surface of a second substrate facing away from the first substrate. In addition, a through hole is provided in the first substrate and the second substrate, and a bridging wiring portion is disposed in the through hole to electrically connect the first outer lead wiring portion and the second outer lead wiring portion, wherein the second outer lead wiring is used for bonding, while the first outer lead wiring only serves as a signal transmission function and is not used for bonding, making a designed width thereof narrower, thereby effectively narrowing the width of a frame of the display panel, and optimizing the display effect.

BRIEF DESCRIPTION OF THE SEVERAL VIEWS OF THE DRAWINGS

To describe the technical solutions in the embodiments of the present disclosure more clearly, the following briefly describes accompanying drawings required for describing the embodiments. Apparently, the accompanying drawings in the following descriptions show merely some embodiments of the present disclosure, and a person skilled in the art may still derive other accompanying drawings from these accompanying drawings without creative efforts.

DESCRIPTION OF SPECIFIC EMBODIMENTS OF THE INVENTION

Figure 1:
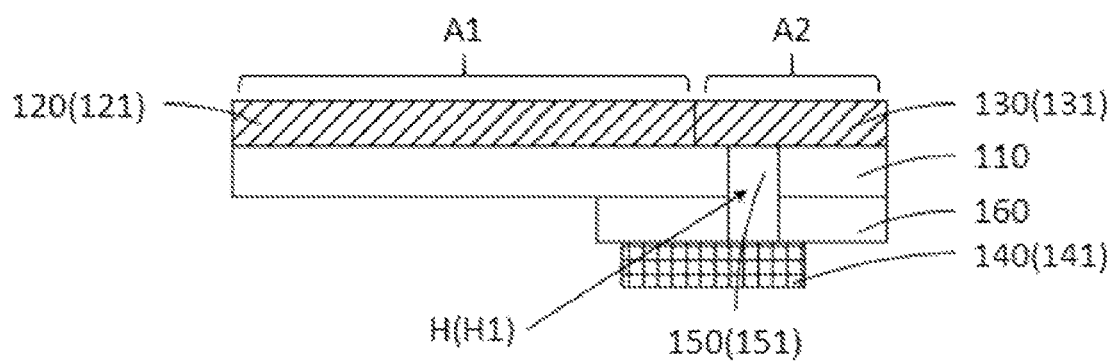
FIG. 1 is a schematic structural cross-sectional view of a display panel according to an embodiment of the present disclosure.

The technical solutions in the embodiments of the present disclosure are clearly and completely described below with reference to the accompanying drawings in the embodiments of the present disclosure. Apparently, the described embodiments are merely some rather than all of the embodiments of the present disclosure. All other embodiments obtained by a person skilled in the art based on the embodiments of the present disclosure without creative efforts shall fall within the protection scope of the present disclosure.

In the description of the present disclosure, it should be understood that orientation or position relationships indicated by the terms such as "center", "longitudinal", "lateral", "length", "width", "thickness", "above", "below", "front", "rear", "left", "right", "vertical", "horizontal", "top", "bottom", "inside", and "outside" are based on orientation or position relationships shown in the accompanying drawings, and are used only for ease and brevity of illustration and description, rather than indicating or implying that the mentioned apparatus or component needs to have a particular orientation or needs to be constructed and operated in a particular orientation. Therefore, such terms should not be construed as limiting of the present disclosure. In addition, the terms "first" and "second" are used for descriptive purposes only and are not to be construed as indicating or implying relative importance or implicitly indicating the number of technical features indicated. Thus, features defined by "first" and "second" may explicitly or implicitly include one or more of the features. In the descriptions of the present disclosure, "a plurality of" means two or more, unless otherwise definitely and specifically limited.

In the present disclosure, the word "exemplary" is used to mean "serving as an example, illustration, or description." Any embodiment described as "exemplary" in the present disclosure is not necessarily construed as being more preferred or advantageous over other embodiments. In order to enable any person skilled in the art to implement and use the present disclosure, the following description is given herein. In the following description, the details are listed for the purpose of explanation. It should be understood that a person of ordinary skill in the art may realize that the present disclosure can also be implemented without using the specific details. In other instances, well-known structures and processes will not be described in detail, so as to avoid unnecessary details from obscuring the description of the present disclosure. Therefore, the present disclosure is not intended to be limited to the illustrated embodiments, but is consistent with the widest scope that conforms to the principles and features disclosed in the present disclosure.

An embodiment of the present disclosure provides a display panel, which will be described in detail below with reference to a schematic structural cross-sectional view of a display panel shown in FIG. 1.

In detail, the display panel includes a display region A1 and a non-display region A2 arranged outside at least one side of the display region A1, and includes a first substrate 110, a second substrate 160, a signal wiring portion 120, a first outer lead wiring portion 130, a second outer lead wiring portion 140, a through-hole portion H, and a bridging wiring portion 150.

The first substrate 110 may be a rigid glass substrate or a flexible substrate according to an actual process requirement.

The second substrate 160 is disposed on a side surface of the first substrate 110 facing away from a light emitting direction of the display panel.

The signal wiring portion 120 is disposed on a side surface of the first substrate 110 along the light emitting direction of the display panel and disposed in the display region A1.

The first outer lead wiring portion 130 is disposed on the side surface of the first substrate 110 along the light emitting direction of the display panel, is connected to the signal wiring portion 120, and is disposed in the non-display region A2.

The second outer lead wiring portion 140 is disposed on a side surface of the second substrate 160 facing away from the first substrate 110, and is configured to bond external driving components, such as a chip on film (COF), a printed circuit board (PCB), thereby driving the display panel.

The through-hole portion H runs through the first substrate 110 and the second substrate 160.

The bridging wiring portion 150 is filled in the through-hole portion H, and is electrically connected to the first outer lead wiring portion 130 and the second outer lead wiring portion 140 respectively, that is, the first outer lead wiring portion 130 and the second outer lead wiring portion 140 are electrically connected through the bridging wiring portion 150.

In the display panel provided in the present embodiment, an outer lead bonding (OLB) region for bonding a COF and a PCB is divided into two parts. One part is a first outer lead wiring portion disposed on a side surface of a first substrate facing a light emitting direction, and the other part is the second outer lead wiring portion on a side facing away from the light emitting direction. In addition, a through hole is provided in the first substrate, and a bridging wiring portion is disposed in the through hole to electrically connect the first outer lead wiring portion and the second outer lead wiring portion, wherein the second outer lead wiring, disposed on the side surface of the first substrate facing away from the light emitting direction, is used for bonding, while the first outer lead wiring, disposed on the side surface of the first substrate facing the light emitting direction, only serves as a signal transmission function and is not used for bonding, making a designed width of the first outer lead wiring narrower, thereby effectively narrowing the width of a frame of the display panel, and optimizing the display effect. Furthermore, when splicing is performed using the display plane to achieve large-size display, a splice joint may be also effectively narrowed, thereby avoiding a problem of affecting the display effect due to an excessively wide splice joint.

Preferably, the first substrate 110 according to an embodiment of the present disclosure is a flexible substrate, a material of the first substrate 110 includes a polyimide material or a film material, and a material of the second substrate 160 includes a film material.

In an embodiment of the present disclosure, only a conductive component (the second outer lead wiring portion 140) is disposed on the second substrate 160. Therefore, the requirement for heat resistance is not high, and film materials may be used to reduce the cost. The side surface of the first substrate 110 facing away from the signal wiring portion 120 and the first outer lead wiring portion 130 is aligned and attached to the side surface of the second substrate 160 facing away from the second outer lead wiring portion 140.

Referring to FIG. 1, in some embodiments, in order to achieve the narrowest frame of the display panel as much as possible, the second outer lead wiring portion 140 is disposed closer to an inner side of the display region A1 than the first outer lead wiring portion 130. Correspondingly, external bonding components (such as the COF and the PCB) are also bonded to one end of the second outer lead wiring portion 140 close to the display region A1, that is, the second outer lead wiring portion 140 and the bonding components are more disposed corresponding to the display region A1 of the display panel, and do not cause a frame of the display panel to be widened.

Figure 2:
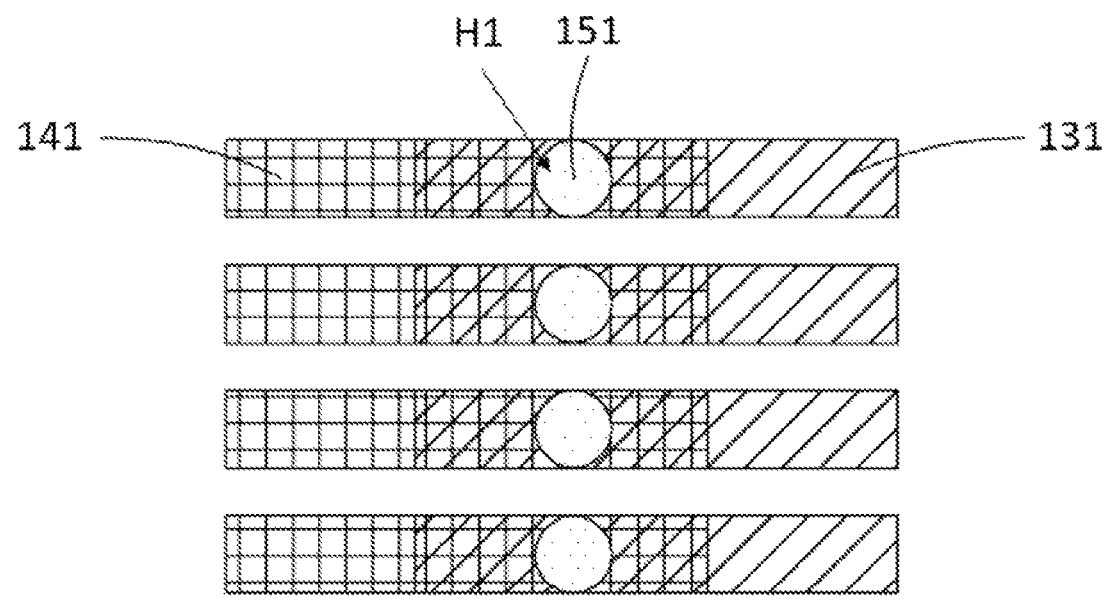
FIG. 2 is a schematic structural top view of a first outer lead wiring portion, a second outer lead wiring portion, and a through-hole portion in a display panel according to an embodiment of the present disclosure.

In some embodiments, referring to a schematic diagram of a plane structure of the display panel shown in FIG. 1 and FIG. 2, in a detailed structure of the display panel, the display panel further includes a plurality of light emitting diode (LED) chips (not shown in the figure) disposed on the side surface of the first substrate 110 along the light emitting direction of the display panel and located in the display region A1. The signal wiring portion 120 includes a plurality of signal wirings 121 connected to the plurality of LED chips, the first outer lead wiring portion 130 includes a plurality of first outer lead wiring 131 electrically connected to the plurality of signal wirings 121 one by one, and each of the LED chips is electrically connected to a corresponding first outer lead wiring 131 through a corresponding signal wiring 121. Furthermore, the through-hole portion H includes a plurality of through holes H1 that are provided corresponding to the plurality of first outer lead wirings 131, the bridging wiring portion 150 includes a plurality of bridging wirings 151 that are correspondingly formed in the plurality of through-holes H1, the second outer lead wiring portion 140 includes a plurality of second outer lead wirings 141, and any one of the second outer lead wirings 141 is electrically connected to the corresponding first outer lead wiring 131 through a bridging wiring 151, that is, each of the LED chips is electrically connected to the corresponding second outer lead wiring 141 through the corresponding first outer lead wiring 131 and the bridging wiring 151. In addition, the second outer lead wiring portion 140 is also required to be bonded with a COF and a PCB (not shown in the figure), to transmit an electrical signal from the second outer lead wiring 141 to the corresponding LED chip, so that each LED chip emits light.

Figure 3:
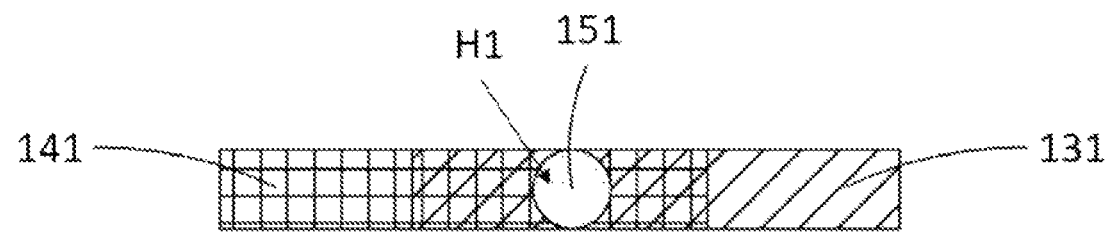
FIG. 3 is a schematic structural top view of a first outer lead wiring, a second outer lead wiring, and a through hole in a display panel according to an embodiment of the present disclosure.
Figure 4:
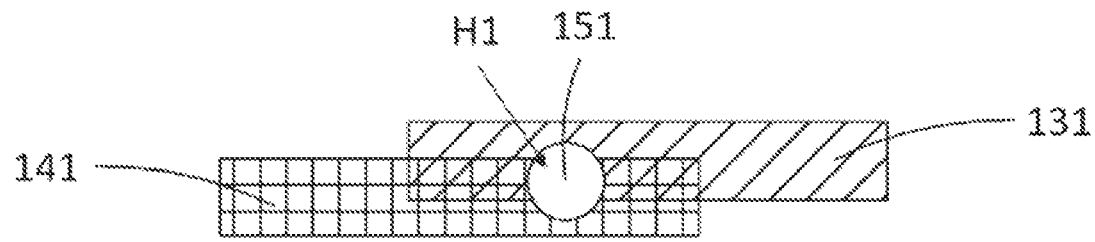
FIG. 4 is a schematic structural top view of a first outer lead wiring, a second outer lead wiring, and a through hole in another display panel according to an embodiment of the present disclosure.
Figure 5:
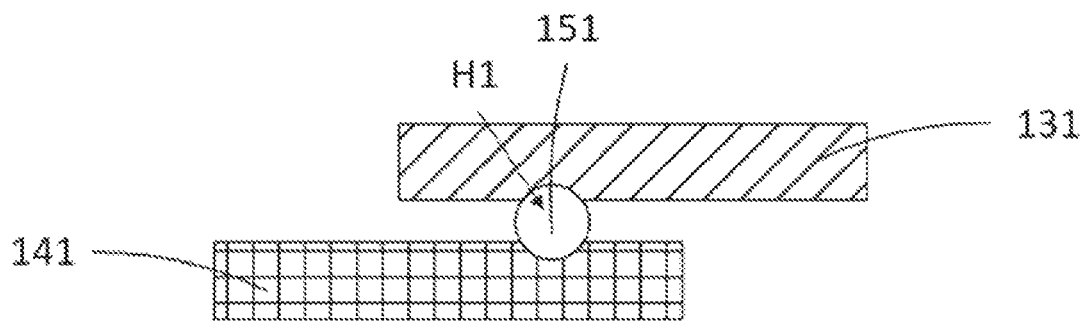
FIG. 5 is a schematic structural top view of a first outer lead wiring, a second outer lead wiring, and a through hole in another display panel according to an embodiment of the present disclosure.

Furthermore, referring to FIG. 3 to FIG. 6, an orthographic projection of the through hole H1 on the first substrate overlaps with an orthographic projection of the first outer lead wiring 131 on the first substrate, and/or the orthographic projection of the through hole H1 on the first substrate overlaps with an orthographic projection of the second outer lead wiring 141 on the first substrate, that is, relative positions of the first outer lead wiring 131, the through hole H1, and the second outer lead wiring 141 may be disposed differently according to an actual process. Several detailed structures are shown below for further explanation:

In an implementation, the orthographic projection of the through hole H1 on the first substrate may alternatively overlap with both the orthographic projection of the first outer lead wiring 131 on the first substrate and the orthographic projection of the second outer lead wiring 141 on the first substrate. For example, as shown in FIG. 3, the orthographic projection of the through hole H1 on the first substrate completely falls into the orthographic projection of the first outer lead wiring 131 on the first substrate and the orthographic projection of the second outer lead wiring 141 on the first substrate; or as shown in FIG. 4, the orthographic projection of the through hole H1 on the first substrate partially falls into the orthographic projection of the first outer lead wiring 131 on the first substrate and the orthographic projection of the second outer lead wiring 141 on the first substrate, and the orthographic projection of the first outer lead wiring 131 on the first substrate overlaps with the orthographic projection of the second outer lead wiring 141 on the first substrate; or as shown in FIG. 5, the orthographic projection of the through hole H1 on the first substrate partially falls into the orthographic projection of the first outer lead wiring 131 on the first substrate and the orthographic projection of the second outer lead wiring 141 on the first substrate, and the orthographic projection of the first outer lead wiring 131 on the first substrate does not overlap with the orthographic projection of the second outer lead wiring 141 on the first substrate.

In an implementation, the orthographic projection of the through hole H1 on the first substrate may alternatively overlap with only the orthographic projection of the first outer lead wiring 131 on the first substrate, but does not overlap with the orthographic projection of the second outer lead wiring 141 on the first substrate; or the orthographic projection of the through hole H1 on the first substrate may alternatively not overlap with only the orthographic projection of the first outer lead wiring 131 on the first substrate, but overlap with the orthographic projection of the second outer lead wiring 141 on the first substrate. Accompanying drawings are not given here for detailed description, which should be easily understood by a person skilled in the art.

Figure 6:
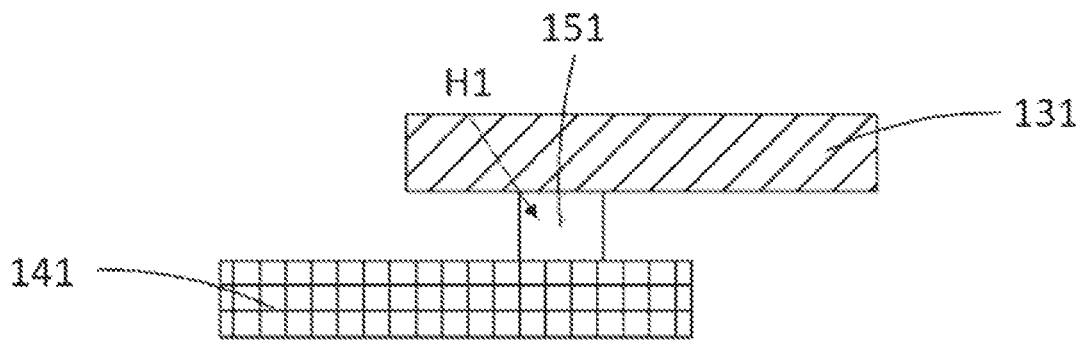
FIG. 6 is a schematic structural top view of a first outer lead wiring, a second outer lead wiring, and a through hole in another display panel according to an embodiment of the present disclosure.

Definitely, the orthographic projection of the through hole H1 on the first substrate may alternatively overlap with neither the orthographic projection of the first outer lead wiring 131 on the first substrate nor the orthographic projection of the second outer lead wiring 141 on the first substrate, as shown in FIG. 6.

In some embodiments, when the orthographic projection of the through hole H1 on the first substrate overlaps with the orthographic projection of the first outer lead wiring 131 on the first substrate, and/or the orthographic projection of the through-hole H1 on the first substrate overlaps with the orthographic projection of the second outer lead wiring 141 on the first substrate, and when the orthographic projection of the through hole H1 on the first substrate overlaps with the orthographic projection of the first outer lead wiring 131 on the first substrate, the through hole H1 runs through the first outer lead wiring 131 while running through the first substrate, so as to increase the reliability of a connection between the bridging wiring 151 in the through hole H1 and the first outer lead wiring 131 as well as the second outer lead wiring 141; and when the orthographic projection of the through hole H1 on the first substrate overlaps with the orthographic projection of the second outer lead wiring 141 on the first substrate, the through hole H1 runs through the second outer lead wiring 141 while running through the first substrate, and the bridging wiring 151 disposed in the through hole H1 is electrically connected to a corresponding side wall of the first outer lead wiring 131 and/or the second outer lead wiring 141, to increase a contact area between the bridging wiring 151 and the first outer lead wiring 131 and/or the second outer lead wiring 141, and improve the reliability of the connection.

Figure 7:
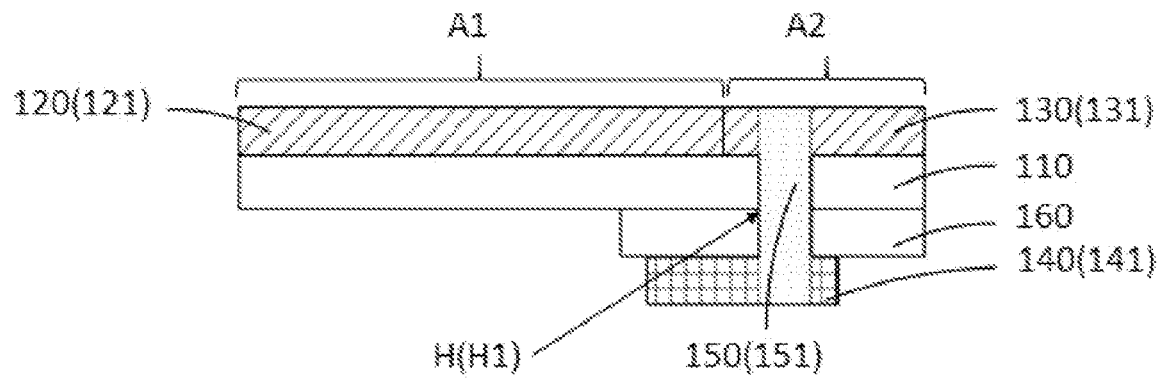
FIG. 7 is a schematic structural cross-sectional view of another display panel according to an embodiment of the present disclosure.

In detail, in an embodiment, when the through hole H1 runs through the first outer lead wiring 131 and the second outer lead wiring 141, and allows the bridging wiring 151 to be electrically connected to corresponding side walls of the first outer lead wiring 131 and the second outer lead wiring 141, a structure is formed shown in FIG. 7.

Figure 8:
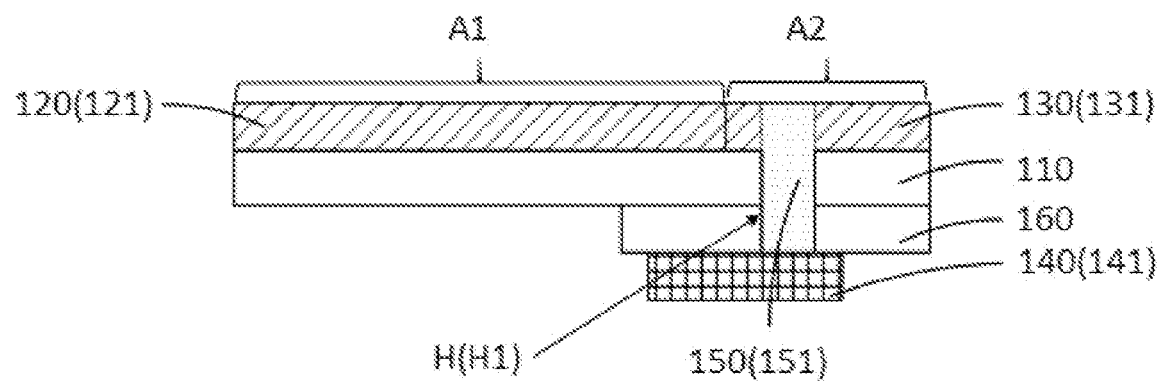
FIG. 8 is a schematic structural cross-sectional view of another display panel according to an embodiment of the present disclosure.

In an embodiment, when the through hole H1 runs through the first outer lead wiring 131 and allows the bridging wiring 151 to be electrically connected to the corresponding first outer lead wiring 131, a structure is formed shown in FIG. 8.

Figure 9:
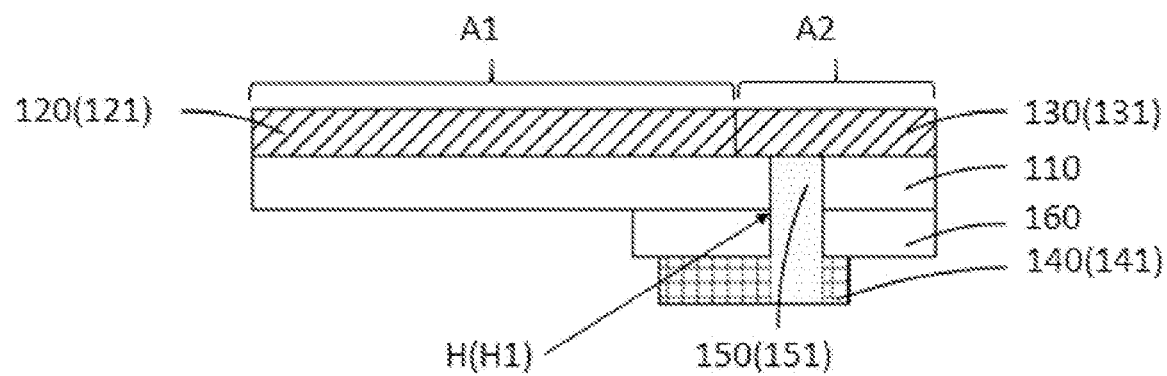
FIG. 9 is a schematic structural cross-sectional view of another display panel according to an embodiment of the present disclosure.

In an embodiment, when the through hole H1 runs through the second outer lead wiring 141 and allows the bridging wiring 151 to be electrically connected to the corresponding second outer lead wiring 141, a structure is formed shown in FIG. 9.

Figure 10:
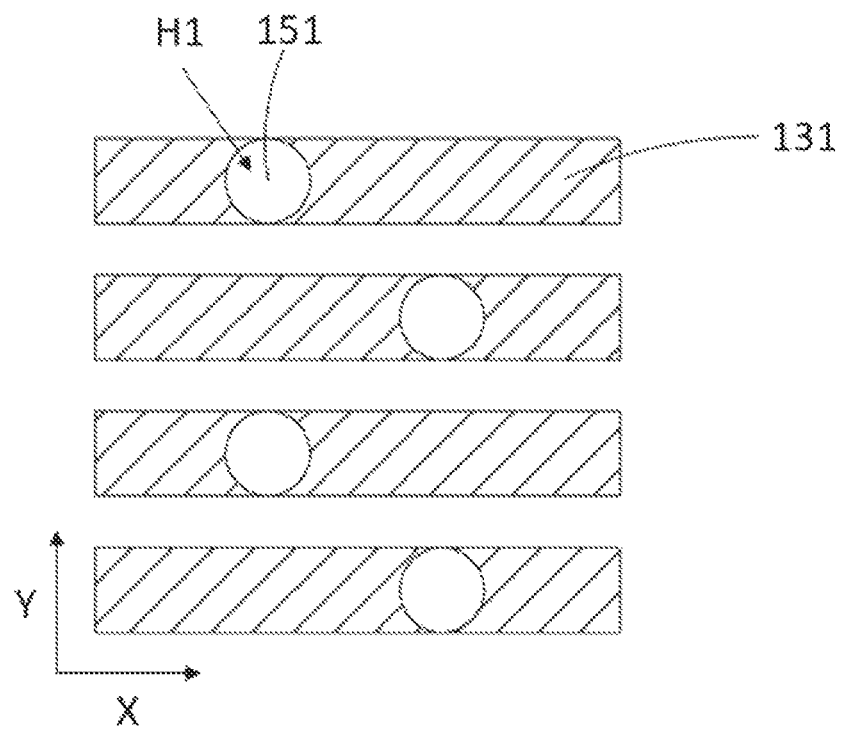
FIG. 10 is a schematic structural top view of a first outer lead wiring portion and a through-hole portion in a display panel according to an embodiment of the present disclosure.

In some embodiments, referring to FIG. 10, orthographic projections of the plurality of through holes H1 on the first substrate are arranged in at least two columns along a direction Y perpendicular to an extending direction X of the first outer lead wirings 131, and two adjacent through holes H1 are arranged alternately along a length direction X of the first outer lead wirings, to reduce the arrangement density of the through holes H1, thereby avoiding the occurrence of a short circuit due to interference between the adjacent through holes H1.

Figure 11:
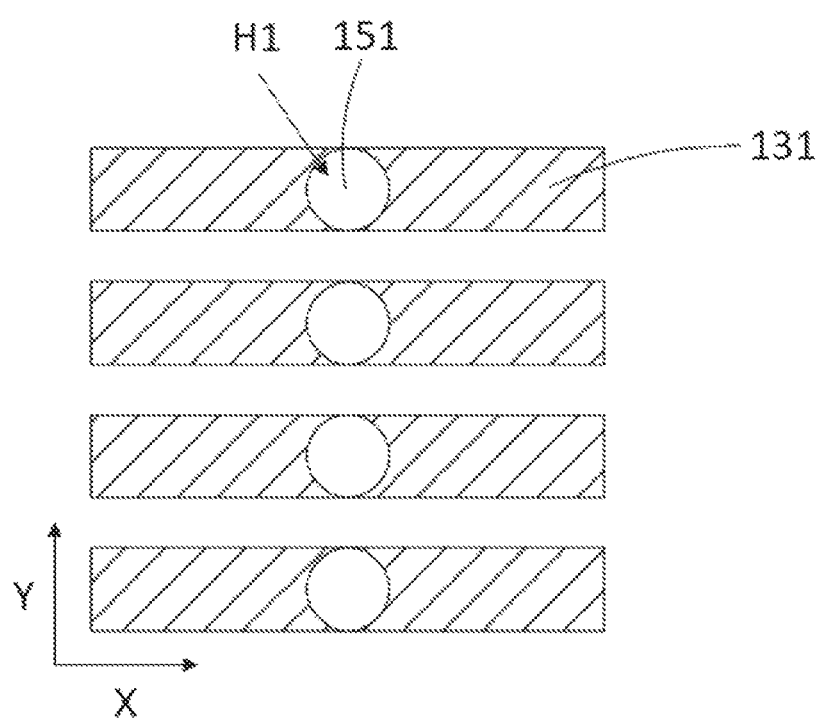
FIG. 11 is a schematic structural top view of a first outer lead wiring portion and a through-hole portion in another display panel according to an embodiment of the present disclosure.
Figure 12:
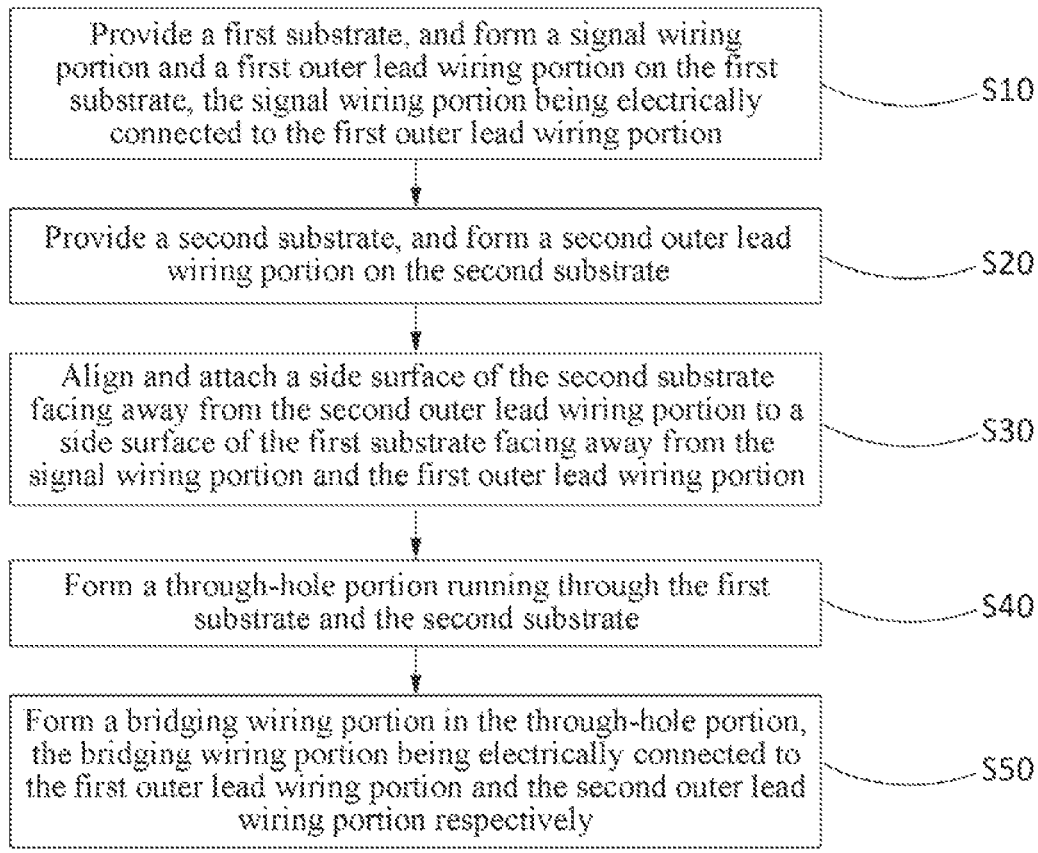
FIG. 12 is a schematic flowchart of a method for preparing a display panel in a text form according to an embodiment of the present disclosure.

In some embodiments, in an actual preparation process, considering the limited precision of a hole-opening process, particular buffer regions are usually required to be reserved at two ends of a preset region of the through hole H1 region. Therefore, the through hole H1 is provided corresponding to a center of the first outer lead wiring 131 along the extending direction X, as shown in FIG. 11, to minimize a length of the first outer lead wiring 131, that is, further compress the width of a frame of a display panel. Generally, the length of the first outer lead wiring may be set to be less than 30 microns.

In some embodiments, a shape of the orthographic projection of the through hole on the first substrate is a circle, an ellipse, a square, or a rectangle.

It should be noted that, only the above structures are described in the above embodiments of the display panel. It may be understood that, in addition to the above structures, the display panel according to the embodiments of the present disclosure may also include any other necessary structures as required, which is not specifically limited here.

In addition, the type of the display panel is not particularly limited, and may be a micro LED display panel, a mini LED display panel, an organic light emitting diode (OLED) display panel, a liquid crystal display (LCD) panel, or the like.

An embodiment of the present disclosure also provides a method for preparing a display panel, which will be described in detail with reference to FIG. 12 and FIGS. 13a to 13e as follows.

Figure 13A:
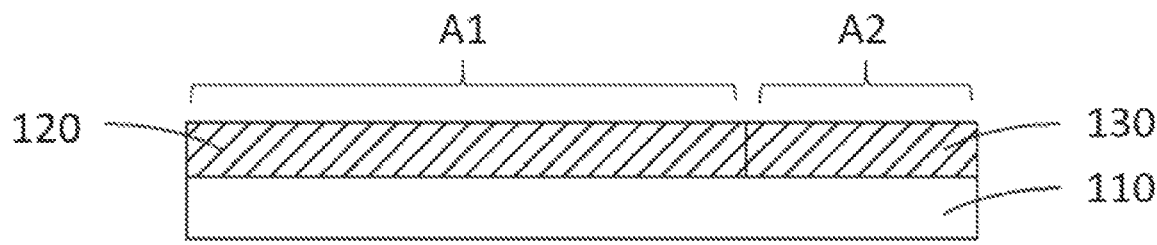
FIGS. 13a to 13e are schematic flowcharts of a structure of a method for preparing a display panel according to an embodiment of the present disclosure.
Figure 13B:
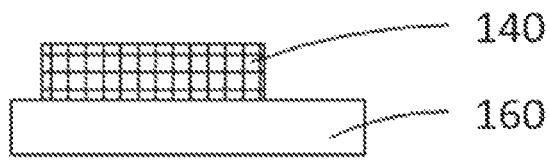
Figure 13C:
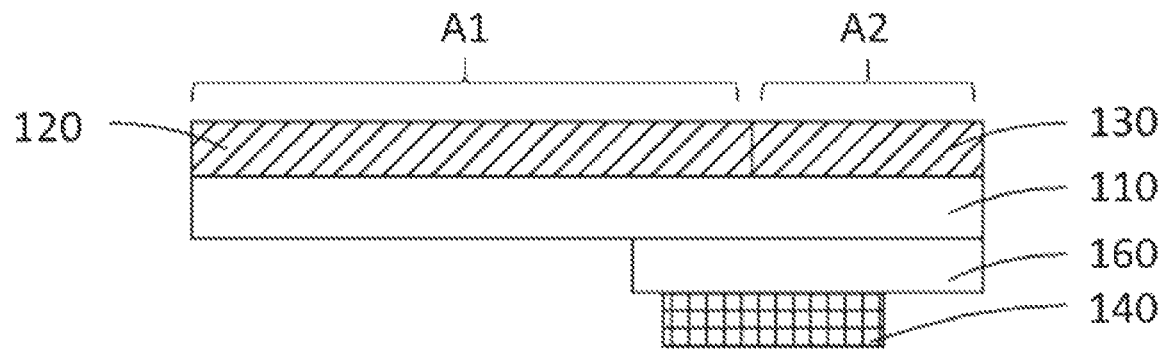
Figure 13D:
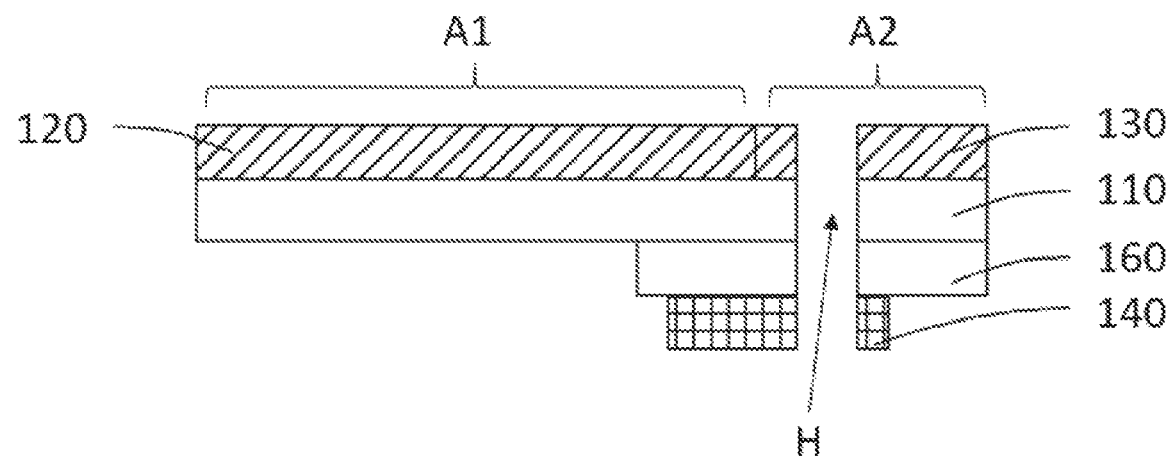
Figure 13E:
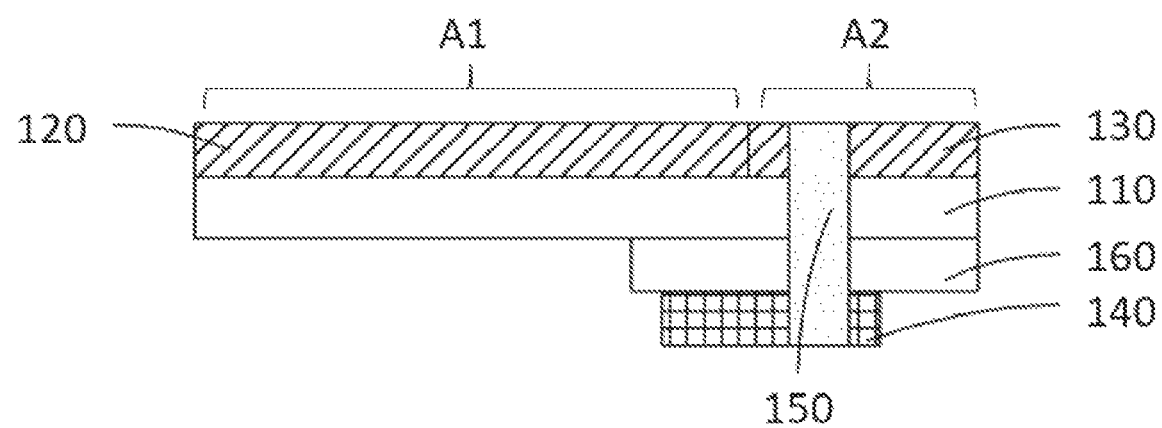

In detail, the method includes the steps of:

S10: providing a first substrate 110, and forming a signal wiring portion 120 and a first outer lead wiring portion 130 on the first substrate 110, the signal wiring portion 120 being electrically connected to the first outer lead wiring portion 130, the signal wiring portion 120 being correspondingly formed in a display region A1, and the first outer lead wiring portion 130 being correspondingly formed in a non-display region A2, so as to form a structure shown in FIG. 13a;

S20: providing a second substrate 160, and forming a second outer lead wiring portion 140 on the second substrate 160, so as to form a structure shown in FIG. 13b;

S30: aligning and attaching a side surface of the second substrate 160 facing away from the second outer lead wiring portion 140 to a side surface of the first substrate 110 facing away from the signal wiring portion 120 and the first outer lead wiring portion 130, so as to form a structure shown in FIG. 13c;

S40: forming a through-hole portion H running through the first substrate 110 and the second substrate 160, so as to form a structure shown in FIG. 13d, wherein the through-hole portion H is usually formed by using a laser opening process; and S50: forming a bridging wiring portion 150 in the through-hole portion H, the bridging wiring portion 150 being electrically connected to the first outer lead wiring portion 130 and the second outer lead wiring portion 140 respectively, so as to form a structure shown in FIG. 13e, wherein the bridging wiring portion 150 is formed by the steps below in detail: injecting silver paste into the through-hole portion H and curing to form the bridging wiring portion 150, and causing the bridging wiring portion 150 to be in an optimal form by controlling the viscosity of the silver paste.

Only the second outer lead wiring portion 140 is required to be formed on the second substrate 160, and no high-temperature manufacturing process is required. Therefore, the second substrate 160 may be a lower-cost and non-high-temperature-resistant substrate, for example, a film substrate commonly used in the art.

In the above embodiments, the description of each embodiment has respective focuses. For a part that is not described in detail in an embodiment, refer to a detailed description of other embodiments above. Details are not described herein again.

A display panel and a method for preparing a display panel according to the embodiments of the present disclosure are described above in detail. Although the principles and implementations of the present disclosure are described by using specific examples in this specification, the descriptions of the above embodiments are merely intended to help understand the method and the core idea of the method of the present disclosure. Meanwhile, a person skilled in the art may make modifications to the specific implementations and application range according to the idea of the present disclosure. In conclusion, the content of this specification is not construed as a limit on the present disclosure.

What is claimed is:

1. A display panel, comprising a display region and a non-display region disposed outside at least one side of the display region, wherein the display panel further comprises:
   a first substrate;
   a second substrate, disposed on a side surface of the first substrate away from a light emitting direction of the display panel;
   a signal wiring portion, disposed on a side surface of the first substrate along the light emitting direction of the display panel and disposed in the display region;
   a first outer lead wiring portion, disposed on the side surface of the first substrate along the light emitting direction of the display panel and in the non-display region, and electrically connected to the signal wiring portion;
   a second outer lead wiring portion, disposed on a side surface of the second substrate away from the first substrate;
   a through-hole portion, running through the first substrate and the second substrate; and a bridging wiring portion, filled in the through-hole portion, and electrically connected to the first outer lead wiring portion and the second outer lead wiring portion respectively;

wherein the signal wiring portion comprises a plurality of signal wirings, the first outer lead wiring portion comprises a plurality of first outer lead wirings electrically connected to the plurality of signal wirings one by one, the through-hole portion comprises a plurality of through holes, the bridging wiring portion comprises a plurality of bridging wirings correspondingly formed in the plurality of through holes, and the second outer lead wiring portion comprises a plurality of second outer lead wirings, one of the second outer lead wirings is electrically connected to the corresponding first outer lead wiring through the bridging wiring;

wherein an orthographic projection of the through hole on the first substrate overlaps with an orthographic projection of the first outer lead wiring on the first substrate, or the orthographic projection of the through hole on the first substrate overlaps with an orthographic projection of the second outer lead wiring on the first substrate;

wherein the through hole runs through the first outer lead wiring, or the through hole runs through the second outer lead wiring, and allows the bridging wiring to be electrically connected to a corresponding side wall of the first outer lead wiring or the second outer lead wiring.

2. The display panel as claimed in claim 1, wherein the through hole is provided corresponding to a center of the first outer lead wiring along an extending direction.

3. The display panel as claimed in claim 1, wherein a shape of an orthographic projection of the through hole on the first substrate is a circle, an ellipse, a square, or a rectangle.

4. The display panel as claimed in claim 1, wherein a material of the first substrate comprises a polyimide material or a film material, and a material of the second substrate comprises a film material.

5. A display panel, comprising a display region and a non-display region disposed outside at least one side of the display region, wherein the display panel further comprises:
a first substrate;
a second substrate, disposed on a side surface of the first substrate away from a light emitting direction of the display panel;
a signal wiring portion, disposed on a side surface of the first substrate along the light emitting direction of the display panel and disposed in the display region;
a first outer lead wiring portion, disposed on the side surface of the first substrate along the light emitting direction of the display panel and in the non-display region, and electrically connected to the signal wiring portion;
a second outer lead wiring portion, disposed on a side surface of the second substrate away from the first substrate;
a through-hole portion, running through the first substrate and the second substrate; and
a bridging wiring portion, filled in the through-hole portion, and electrically connected to the first outer lead wiring portion and the second outer lead wiring portion respectively;

wherein the signal wiring portion comprises a plurality of signal wirings, the first outer lead wiring portion comprises a plurality of first outer lead wirings electrically connected to the plurality of signal wirings one by one, the through-hole portion comprises a plurality of through holes, the bridging wiring portion comprises a plurality of bridging wirings correspondingly formed in the plurality of through holes, and the second outer lead wiring portion comprises a plurality of second outer lead wirings, one of the second outer lead wirings is electrically connected to the corresponding first outer lead wiring through the bridging wiring;

wherein orthographic projections of the plurality of through holes on the first substrate are arranged in at least two columns along a direction perpendicular to an extending direction of the first outer lead wirings, and two adjacent through holes are arranged alternately along the extending direction of the first outer lead wirings.

6. The display panel as claimed in claim 5, wherein the orthographic projection of the through hole on the first substrate overlaps with an orthographic projection of the first outer lead wiring on the first substrate, or the orthographic projection of the through hole on the first substrate overlaps with an orthographic projection of the second outer lead wiring on the first substrate.

7. The display panel as claimed in claim 5, wherein a shape of an orthographic projection of the through hole on the first substrate is a circle, an ellipse, a square, or a rectangle.

8. The display panel as claimed in claim 5, wherein a material of the first substrate comprises a polyimide material or a film material, and a material of the second substrate comprises a film material.

* * * * *